US006614372B1

(12) United States Patent
Shi

(10) Patent No.: US 6,614,372 B1
(45) Date of Patent: Sep. 2, 2003

(54) (N-1)/N CURRENT REDUCTION SCHEME IN A N-TO-ONE PARALLEL-TO-SERIAL CONVERSION

(75) Inventor: Hui Shi, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/074,200

(22) Filed: Feb. 12, 2002

(51) Int. Cl.[7] .................................................. H03M 9/00
(52) U.S. Cl. ........................ 341/101; 327/407; 341/100; 341/144
(58) Field of Search ................................ 341/100, 101, 341/144; 327/407; 375/257; 326/96

(56) References Cited

U.S. PATENT DOCUMENTS

| 4,218,758 A | * | 8/1980 | Allen et al. ................... 341/101 |
| 5,243,347 A | * | 9/1993 | Jackson et al. ............. 341/144 |
| 5,714,904 A | * | 2/1998 | Jeong ........................ 327/407 |
| 5,959,559 A | * | 9/1999 | Weder ........................ 341/101 |
| 5,978,419 A | * | 11/1999 | Cassiday et al. ............. 375/257 |
| 5,982,309 A | * | 11/1999 | Xi et al. ...................... 341/101 |
| 6,377,079 B1 | * | 4/2002 | Fiedler ......................... 326/96 |

OTHER PUBLICATIONS

Intel, "LXT11001 XGMII–to–XAUI Transceiver." *Advance Information Data Sheet*. pp. 1–296. May 2001.

* cited by examiner

*Primary Examiner*—Jean Bruner Jeanglaude
(74) *Attorney, Agent, or Firm*—Pillsbury Winthrop LLP

(57) ABSTRACT

A system and method are used to convert a parallel datastream to a serial datastream. N number of parallel bits are input to n number of selection devices. One of the n number of selection devices is selected as an active selection device. The active selection device is directly coupled to a corresponding current source. The (n–1) inactive selection devices are coupled to a current steering device. The current steering device is coupled to the corresponding (n–1) inactive selection devices. The current steering devices allow taking over by input data bit or latch on the previous bit if there is no input. The parallel bit is converted to a bit in the serial datastream by generating a voltage representative of a value of the serial bit utilizing a combined current from the n current sources.

22 Claims, 6 Drawing Sheets

(N−1)/N CURRENT REDUCTION SCHEME IN A N-TO-ONE PARALLEL-TO-SERIAL CONVERSION

BACKGROUND OF THE INVENTION

The advent of high-speed data communications has led to new protocols being developed that transfer data at high rates of speed. Ten Gigabit Ethernet is one such protocol. Ten Gigabit Ethernet has defined two interfaces between a physical layer device (PHY) and an Ethernet controller, also referred to as a media access controller (MAC). These two interfaces are a 10 Gigabit per second (Gbps) Attachment Unit Interface, also referred to as "XAUI," and a 10 Gbps Media Independent Interface, also referred to as "XGMII."

XGMII is a parallel interface consisting of 32 data lines, one clock line, and four control lines in each direction. The clock runs at 156.25 megahertz and the data is clocked in and out on both the rising and falling edges of the clock. XAUI is a serial interface of four lanes of data that are 8 bit/10 bit (8 b/10 b) encoded. The encoding process takes the parallel data of XGMII and divides it into four lanes, each having 10 bits. Each lane runs at 3.125 Gigabaud in each direction. XAUI has no clock, because the clock signal is embedded in the data as part of the 8 b/10 b encoding.

XGMII is designed to be a standard parallel digital interface between the MAC and the PHY, but it is difficult to implement on standard printed circuit board (PCB) material over nominal trace distances because it is a parallel bus operating at high speeds. The alternative serial interface, XAUI, was developed to allow the distance between the PHY and the MAC to be at least 20 inches of PCB trace.

Most chips having a MAC are digital chips and therefore have a XGMII interface. Thus, devices are needed to convert XGMII to XAUI. A representative example is the Intel LXT1001 chip. The LXT1001 chip is placed near 10 Gigabit MAC chips that have a XGMII interface. The Intel LXT1001 chip accepts parallel data from the XGMII, which provides 32 data signals, four control signals and a clock signal. The data is latched into four XGMII input buffers. The data from the XGMII input buffers is encoded by an 8 b/10 b encoder. The encoding ensures that sufficient transitions are embedded to allow the receiver to recover a clock from the serial bit data stream.

After encoding, the four streams of 8 b/10 b encoded characters are each transmitted to an XAUI transmitter. The XAUI transmitter includes a pre-transmit equalizer, a parallel-to-serial converter and an XAUI output buffer. For each data stream, the data bits are clocked in parallel from the equalizer to the parallel-to-serial converter, and transmitted in serial to the output buffer.

In a high-speed serial link application, circuit designers encounter the requirement to convert a n bit parallel data stream into bits in a serial datastream. A common method to implement this conversion is utilize a n-to-1 multiplexing scheme in which n gated switches are applied to allow n bits of data go through in sequence. The outputs of the n gated switches are tied together to go to a next stage, which is most often a buffer.

When data speeds reach the Gigahertz range, a simple complimentary metal oxide semiconductor (CMOS) transmission gate switch is not sufficient. Furthermore, because of the different response speeds of positive polarity metal oxide semiconductor (PMOS) and negative polarity metal oxide semiconductor (NMOS) (NMOS is utilized to pull down the clock transition from high to low & PMOS is utilized when the transition is from low to high), the rising and falling edges of the clock signal are often different and this difference translates into clock duty cycle distortion. This problem is worsened because PMOS and NMOS vary differently over process and temperature thresholds.

FIG. 1 illustrates a current mode logic (CML) cell in use in Gigahertz circuit applications according to the prior art. In Gigahertz applications, these switches are often CML cells as shown in FIG. 1. However, the utilization of CML cells introduces a circuit with low current efficiency, meaning these circuits have a high current consumption, which is a critical parameter in many applications.

FIG. 2 illustrates a block diagram of CML cells and the passage of data through the CML cells according to the prior art. Any of these n CML cells actually pass data for only 1/N of a clock cycle and sit idle for the remaining clock cycle time ((N−1)/N). During the idle time, the tail current of the CML cell is thrown away to the power supply.

FIG. 3 illustrates a circuit diagram of a conventional multiplex implementation of parallel-to-serial conversion according to the prior art. In this embodiment, the current branches are connected to the output load one at a time. In an embodiment where the parallel-to-serial conversion is a n bit to one bit conversion, the required tail current of each of the current branches be $n \times I_0$. In the conventional multiplex, only one of the branches is actively converting but all of the current sources are being utilized in a sequent fashion. Thus, the total current is $n \times n \times I_0$.

Accordingly, a need exists for a parallel-to-serial conversion system that reduces current consumption by a significant factor.

DETAILED DESCRIPTION

Figure 1:
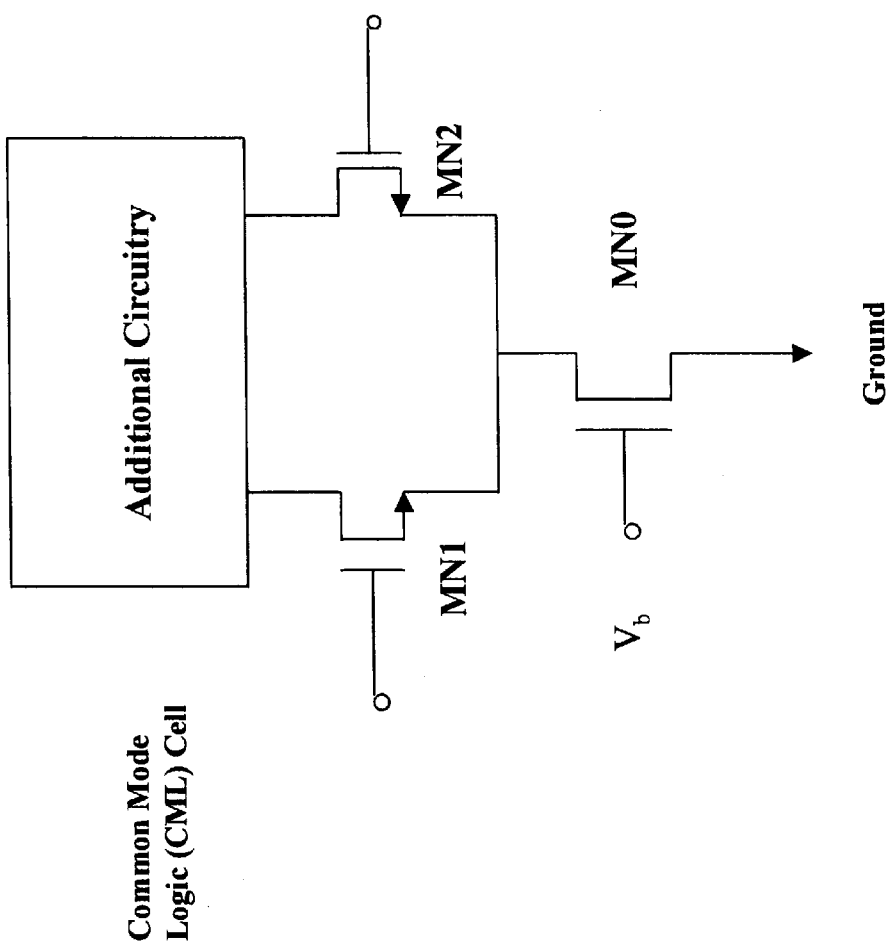
FIG. 1 illustrates a current mode logic cell in use in Gigahertz circuit applications according to the prior art.
Figure 2:
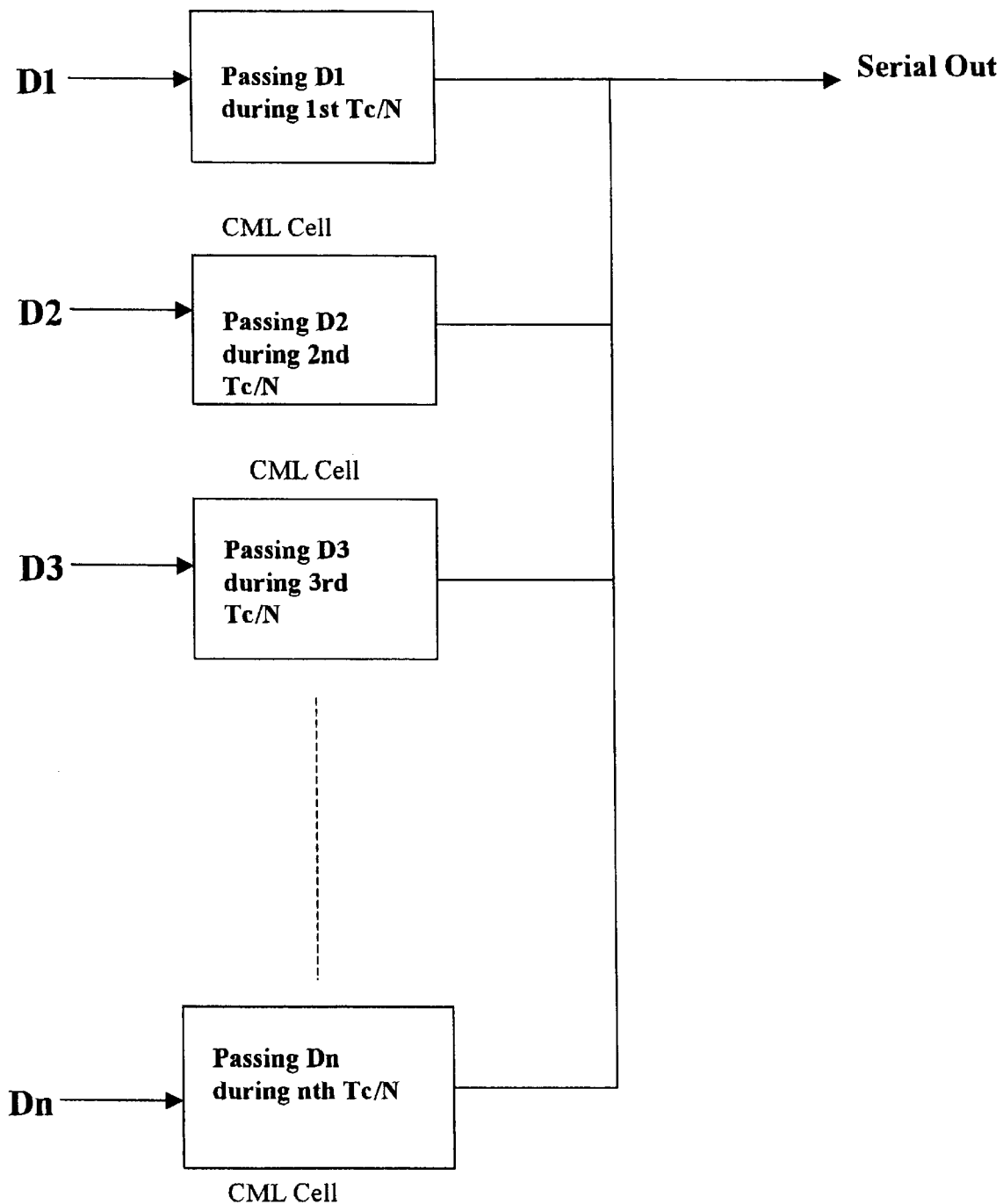
FIG. 2 illustrates a block diagram of current mode logic cells and the passage of data through the CML cells according to the prior art.
Figure 3:
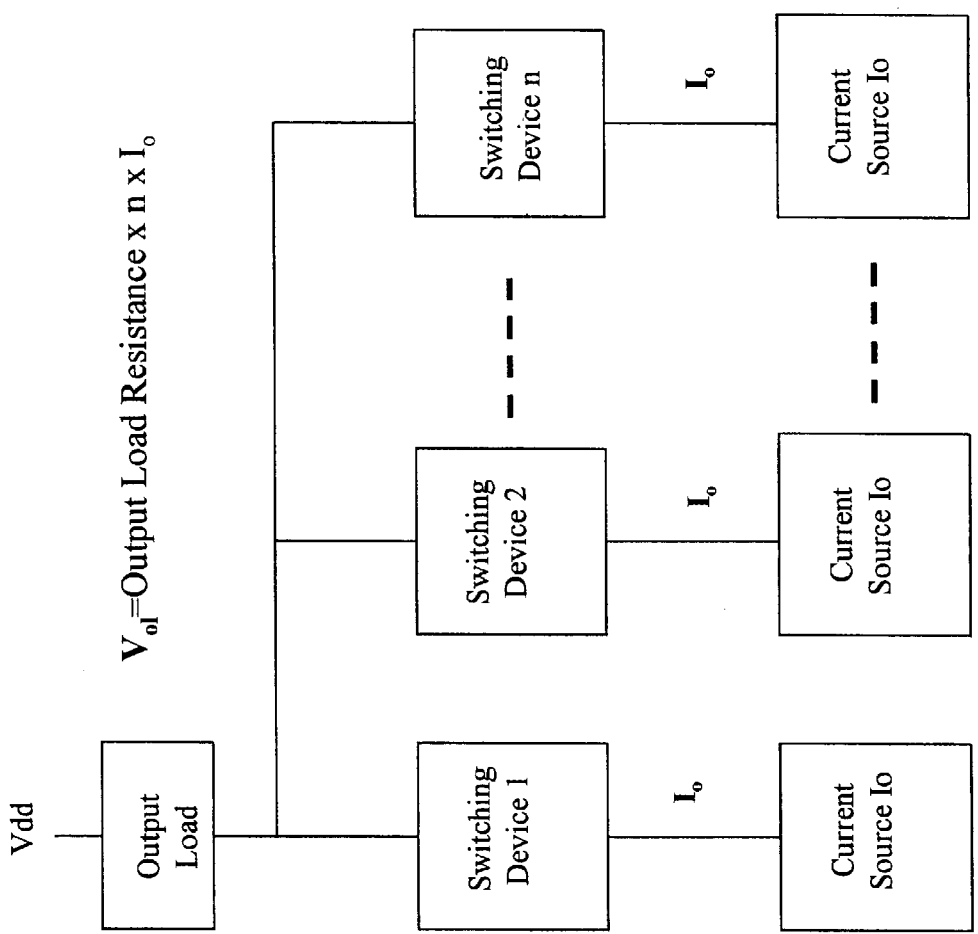
FIG. 3 illustrates a circuit diagram of a conventional multiplex implementation of parallel-to-serial conversion according to the prior art.
Figure 4:
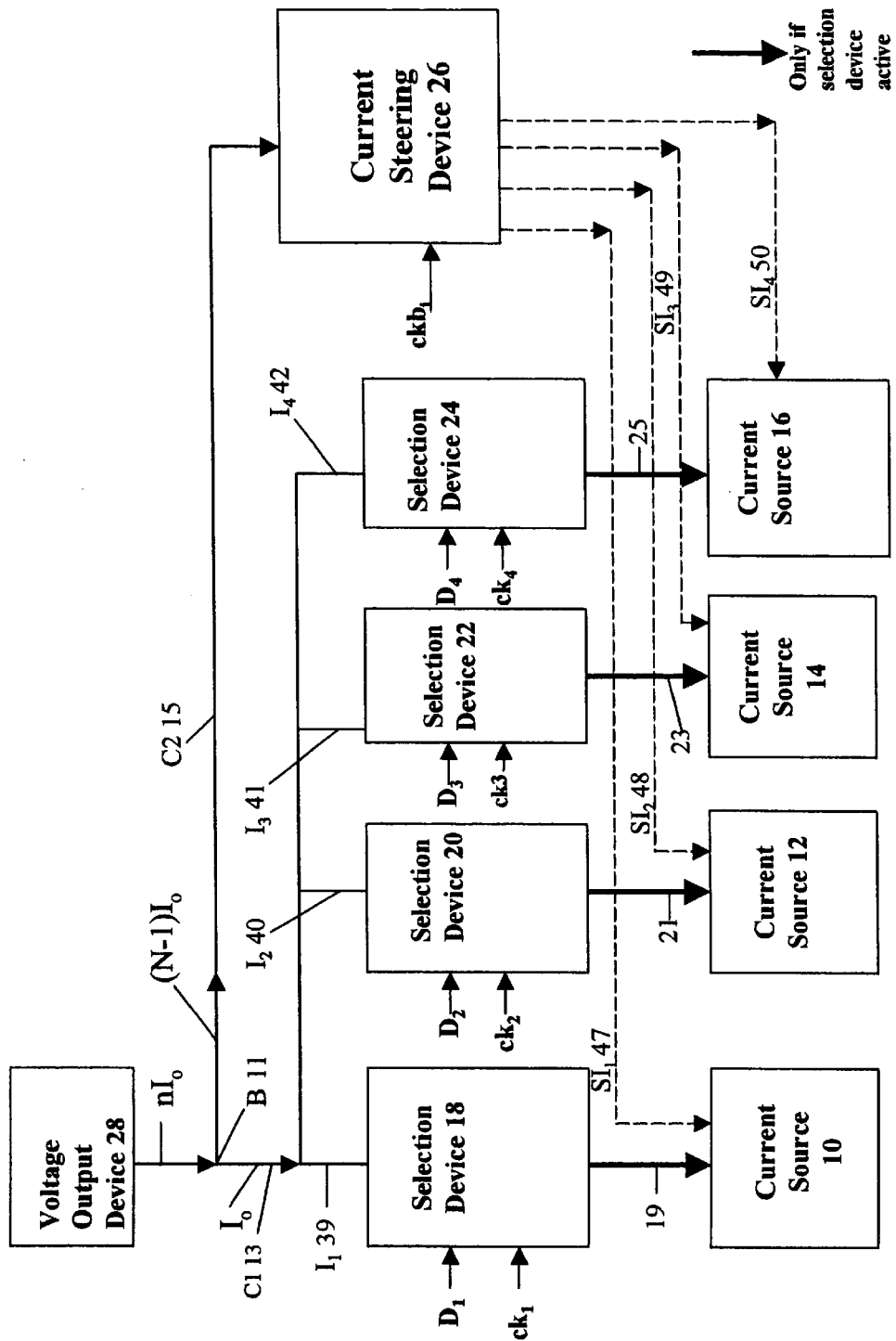
FIG. 4 illustrates a block diagram of a conversion device according to an embodiment of the present invention.

The present invention converts a parallel datastream into a serial bit datastream in a current efficient manner. FIG. 4 illustrates a block diagram of a conversion device according to an embodiment of the present invention. The conversion device results in a reduction in current consumption by a factor of (n−1)/n during a n-to-1 parallel-to-serial conversion. The conversion device includes a plurality of current sources 10–16, a plurality of switching devices 18–24, a current steering device 26, and a voltage output device 28.

The voltage output device 28 provides an output voltage representative of the value of a bit in the serial datastream that has been converted from a parallel bit in the parallel datastream. The value of the serial bit is the current going through the resistor, e.g., n×$I_o$, multiplied by the resistance/impedance, e.g., n×$I_o$×R, of the voltage output device 28. In the present invention, the current going through resistor is the combined current with the magnitude of the number of bits being converted from parallel to serial, e.g., n, times the magnitude of the current generated from each current source.

Depending on the how the circuit is designed, the magnitude of the voltage amplitude required in order to identify if a signal is, illustratively, high or low, may vary. As discussed previously, the output voltage is equal to $I_o$×R. In a high-speed circuit, including circuits operating in the Gigahertz range, the resistance, R, has an upper limit. The upper limit of resistance, illustratively R, is a function of the highest signal frequency and the capacitance load. If the loading capacitance for the parallel-to-serial conversion device is $C_o$, R cannot be greater than R=1/(2π$f_c C_o$), where $f_c$ is the highest frequency to which the circuit is able to respond.

Therefore, if the specification for the input voltage requires a signal amplitude of $V_o$ and the maximum resistance is R, then at least $V_o$/R current is used to meet the specification. Let the required current, $V_0$/R, equal n×$I_0$. In the conventional design, each current branch, or tail current for each bit, has a required current of the magnitude, e.g., n×$I_0$. However, with an embodiment of the present invention, each current branch, or tail current for each bit, has a magnitude of 1/nth the required current, e.g., $I_0$. Thus, the total branch current (including n branches) for the n bit conversion is n×n×$I_0$ in the conventional design and n×$I_0$ for an embodiment of the present invention. Therefore, the reduction in current compared to the common multiplex is (N−1/N).

The number of current sources 10–16 and selection devices 18–24 are directly proportional to the number of parallel bits being converted into a serial bit stream. Illustratively, an n-to-1 bit parallel-to-serial conversion requires that n current sources are present in the conversion device. For example, in an 8-to-1 parallel-to-serial conversion, eight current sources are present in the conversion device. Similarly, in a 10-to-1 parallel-to-serial conversion, ten selection devices are present in the conversion device.

As illustrated in FIG. 4, the current flowing through voltage output device 28 reaches point B 11 in the diagram and may be split into a first current C1 13 and a second current C2 15. Because only one bit is being converted at one time, only one selection device is active at each time. Thus, one selection device is an active selection device and (n−1) selection devices are non-active selection devices.

If the selection device 18–24 is active (meaning the bit, $D_j$, input into the selection device 18–24 is being converted from a parallel bit to a bit in a serial datastream), an active selective device (one of selection devices 18–24) accepts as input the first current C1 13 and connects the first current directly to the corresponding current source. This current may be referred to as the active selection device current. The current may have a magnitude of Io.

For example, as illustrated in FIG. 4, if the second bit is currently undergoing a parallel-to-serial conversion, then selection device 20 is directly coupled to current source 12 and selection device current 21 is the active selection device current.

If the selection device is inactive (meaning the bit, $D_j$, input into the selection device is not being converted), the non-active selection devices do not draw current. Therefore, the remaining current from the voltage output device becomes the second current C2 15 and is directed towards the current steering device 26. Because (n−1) selection devices are inactive at all times when a parallel-to-serial conversion is taking place, the current steering device 26 may receive a current with a magnitude of (n−1)×Io. The current steering device 26 directs the second current to the current sources 10–16 which correspond to the non-active selection devices. The currents being directed to the current sources 10–16 from the current steering device 26 may be referred to as the non-active selection device currents.

Utilizing the same example as above, selection device 20 is the active selection device. Thus, selection device 18, selection device 22, and selection device 24 are inactive. Therefore, no current flows through current paths $I_1$ 39, $I_3$ 41, and $I_4$ 42. Instead, the second current C2 15 flows to the current steering device 26. The current steering device 26 receives the second current C2 15 as an input and outputs three non-active selection device currents, e.g., $SI_1$ 47, $SI_3$ 49, and $SI_4$ 50, to the corresponding current sources 10, 14, and 16, respectively.

A plurality of clock signals, e.g., $ck_1$, $ck_2$, $ck_3$, and $ck_4$, may be input into the selection devices 18–24 along with the parallel data bits, e.g., $D_1$–$D_4$. The plurality of clock signals identifies which selection device is active, e.g., currently converting the parallel bit. Only one of the parallel bits may be converted at each moment in time, so only one clock signal may indicate that its selection device is active. The clock signal may indicate a selection device is active by, illustratively, going from a low state to a high state. Conversely, the clock signal may indicate the selection device is inactive by, illustratively, going from a high state to a low state.

For example, as illustrated in FIG. 4, if the fourth parallel bit $D_4$ is currently being converted to a bit in a serial datastream, then clock signal $ck_4$ indicates that selection device 24 is active. Therefore, current $I_4$ 42 is switched directly to current source 16 and selection device current 25 is the active selection device current. Clock signals $ck_1$, $ck_2$, and $ck_3$ do not undergo a transition from low to high and therefore switching devices 18, 20, and 22 are inactive, and no current flows through switching devices 18, 20, and 22. The current steering device 26 steers the second current C2 15 to the corresponding current sources, e.g, 10, 12, and 14. This configuration allows the use of only n×$I_o$ current for all n tail current sources, which as mentioned previously is a significant reduction from the use in the prior art of (n×n×$I_o$) current.

Figure 5:
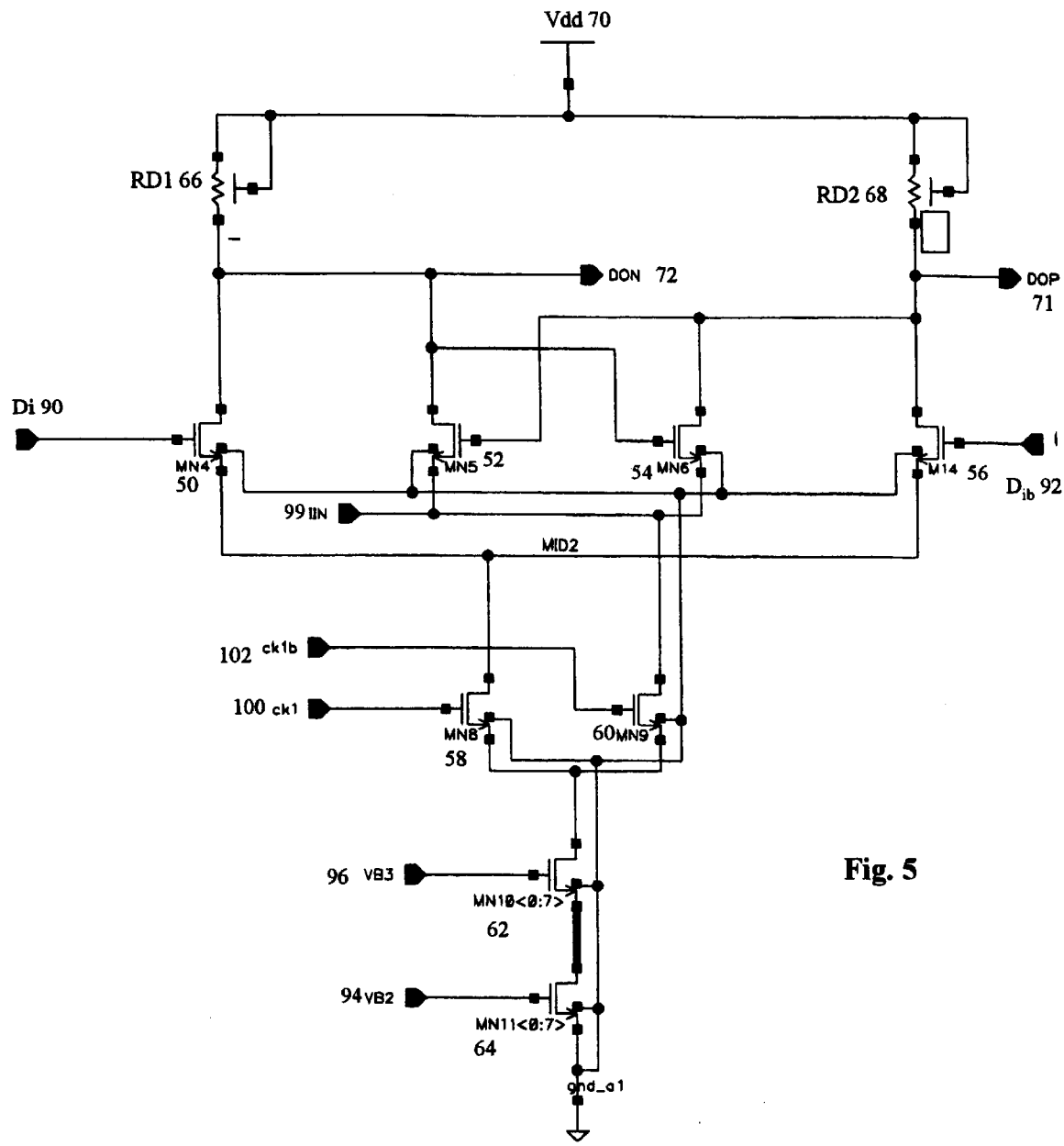
FIG. 5 illustrates a circuit diagram for a first conversion module for a conversion device according to an embodiment of the present invention.
Figure 6:
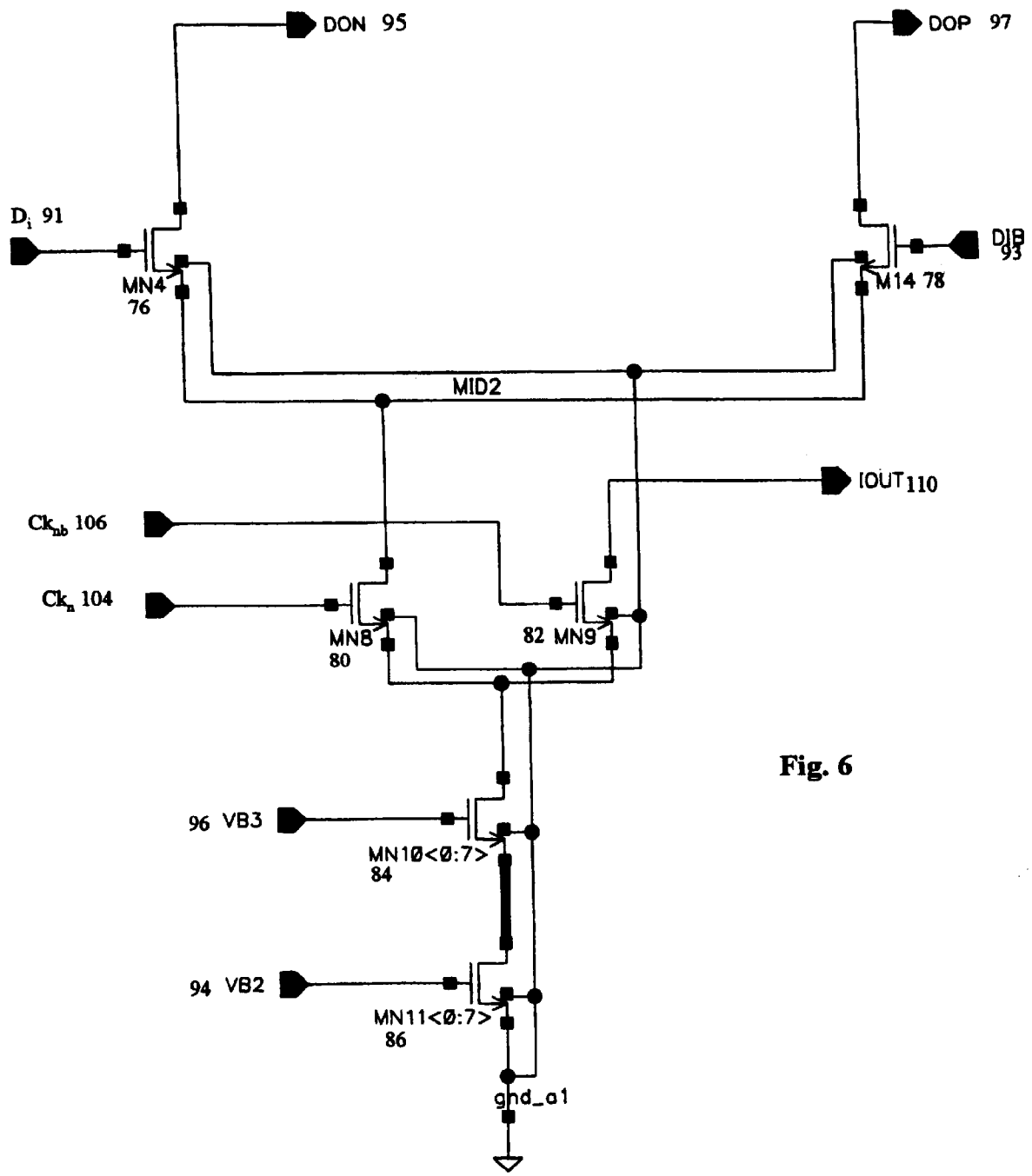
FIG. 6 illustrates a circuit diagram for a second conversion module for a conversion device according to an embodiment of the present invention.

FIGS. 5 and 6 illustrate a specific circuit diagram of an embodiment of the present invention. FIG. 5 illustrates a first conversion module for a first bit in a n-to-1 bit parallel-to-serial conversion. FIG. 6 illustrates a second conversion module for remaining (n−1) bits in a parallel-to-serial conversion. For example, if a conversion device requires an eight-to-one bit parallel-to-serial conversion, one first conversion module is required along with seven second conversion modules.

A first conversion module may include transistors MN4 50, MN5 52, MN6 54, M14 56, MN8 58, MN9 60, MN10 62, and MN11 64, resistors RD1 66 and RD2 68, and a voltage supply VDD 70. In an embodiment of the present invention, the transistors may be NPN transistors. Illustratively, the first terminals of the transistors are the collector; the second terminals of the transistors are the base; and the third terminals of the transistors are the emitters. Alternatively, the transistors may be field-effect transistors.

Illustratively, the first terminals of the transistors are the drain; the second terminals of the transistors are the gate, and third terminals of the transistors are the source. In addition, there is a fourth terminal for field-effect transistor, which is the body.

A first terminal of MN4 50 may be connected to a 1st end of resistor RD1 66, a 1st terminal of MN5 52, and a 2nd terminal of MN6 54. A measuring point node DON 72 may be located at the node of the 1st terminal of MN4 50, the first end of RD1 66, the 1st terminal of MN5 52, and the 2nd terminal of MN6 54. A second end of resistor RD1 66 may be connected to the voltage supply VDD 70.

A 1st terminal of M14 56 may be connected to a first end of resistor RD2 68, a 2nd terminal of MN5 52, and a 1st terminal of MN6 54. A measuring point node DOP 71 may be located at the node of the 1st terminal of M14 56, the first end of RD2 68, the 2nd terminal of MN5 52, and the 1st terminal of MN6 54. A second end of resistor RD2 68 may be connected to the voltage supply VDD 70. A third terminal of M14 56 and a third terminal of MN4 50 are connected to a 1st terminal of MN8 58. In addition, if the invention is implemented utilizing field-effect transistors, a 4th terminal of MN4 50, M14 56, MN5 52, MN6 54, MN8 58, MN9 60, MN10 62, and MN11 64 may be all connected together to a reference voltage, which may be a ground.

In the first conversion module, as illustrated in FIG. 5, a 3rd terminal of MN5 52 and MN6 54 may be connected to a 1st terminal of MN9 60. A 3rd terminal of MN8 58 and MN9 60 may be connected to a 1st terminal of MN10 62. A 3rd terminal of MN10 62 may be connected to the 1st terminal of MN11 64 in a cascade configuration.

Referring to FIG. 6, each second conversion mechanism may include transistors MN4 76, M14 78, MN8 80, MN9 82, MN10 84, and MN11 86. The node DON 95 may be connected to a 1st terminal of MN4 76. The node DOP 97 may be connected to a 1st terminal of M14 78. DON 95 and DOP 97 may also be connected to DON 72 and DOP 71 (see FIG. 5), respectively. That means the resistors in FIG. 5 are shared for all the modules. A third terminal of MN4 76 and M14 78 may both be connected to a 1st terminal of MN8 80. Nodes Iout 110 may all be connected to a 1st terminal of MN9 82. A third terminal of MN8 80 and MN9 82 may be connected to a 1st terminal of MN10 84. A third terminal of MN10 84 may be connected to a 1st terminal of MN11 86 in a cascade configuration. In addition, if the invention is implemented utilizing field effect transistors, the 4th terminals of MN4 76, M14 78, MN8 80, MN9 82, MN10 84, and MN11 86 may all be connected together to a reference voltage, which may be a ground.

The conversion of a parallel bit to a bit in a serial datastream occurs in the upper section of the first and second conversion modules illustrated in FIGS. 5 and 6, respectively. For example, as illustrated in FIG. 5 for a first conversion module, a parallel bit, which may be represented as a differential signal $D_i$ 90 and $D_{ib}$ 92, is input into the 2nd terminal of transistors MN4 50 and M14 56, respectively. If the parallel bit is, illustratively, high to represent a 1 value, then $D_i$ 90 is a higher value than $D_{ib}$ 92. Because the parallel bit is, illustratively, high, transistor MN4 50 is switched on and current flows through resistor RD1 66. The corresponding node voltage at DON 72 is VDD 70 minus the product of the current value, e.g., $n \times I_o$, times the value of the resistance, e.g., RD1 66. In other words, node voltage at DON 72=Vdd−(n×I$_o$×RD1).

In the example, no current flows through the transistor M14 56 because it is not switched on. Therefore, the value of DOP 71 is equal to Vdd 70 (Vdd=DOP). The output voltage for the circuit is defined as DOP 71−DON 72. In this case, where $D_i$ 90 is higher than $D_{ib}$ 92, DOP 71 is greater than DON 72 (Vdd compared to (Vdd−(n×I$_o$×RD1))), and the output voltage is, illustratively, high. The output signal magnitude is (Vdd−(Vdd−n×I$_o$×RD1)), which is equal to I$_o$×RD1.

In contrast, if $D_{ib}$ 92 is higher than $D_i$ 90 in the first conversion module, then the parallel bit has, illustratively, a low value, e.g., 0. Transistor M14 56 is switched on and the current flows through resistor RD2 68. In this case, the voltage at node DON 72 is Vdd 70, and the voltage at node DOP 71 is (Vdd−(n×I$_o$×RD1)). Therefore, the output voltage is, illustratively, low, and the output signal magnitude is equal to (−n×I$_o$×RD2).

Referring to FIG. 6, if a second conversion module is active, then either MN4 76 or M14 78 may be switched on, depending on whether $D_i$ 91 is higher than $D_{ib}$ 93 (a high condition turning MN4 76 on) or $D_{ib}$ 93 is higher than $D_i$ 91 (a low condition turning M14 78 on). This setup establishes a current path from the current source, e.g., MN10 84 and MN11 86, through MN8 80 to MN4 76 if a high condition is present or through MN8 80 to M14 78 if a low condition is present. The measurement point nodes DON 95 and DOP 97 for all of the second conversion modules are tied together with the measuring point nodes DON 72 and DOP 71 (see FIG. 5) of the first conversion module. Because of this configuration and measuring point nodes DON 95 and DOP 97 being connected to the first terminals of RD1 66 and RD2 68, respectively, the current flowing through RD1 66 and RD2 68 is directed to the active second conversion module. Therefore, the voltage produced across RD1 66 and RD2 68 (see FIG. 5) is representative of the value of the active second conversion module's parallel data bit using the same analysis discussed previously and the output signal magnitude is n×Io multiplied by either RD1 (if the value of the parallel data bit is high) or RD2 (if the value of the parallel data bit is low). Usually, RD1 and RD2 have equal values.

The output voltage Vo necessary to indicate the high value of a serial bit in the datastream is dependent on the specification of the device receiving the datastream. Depending on how the receiving circuit is designed, the magnitude of the voltage amplitude required to identify if a signal is, illustratively, high or low may vary. As discussed previously, the output voltage is equal to n×Io×R. In a high-speed circuit, including circuits operating in the Gigahertz range, the resistance, R, has an upper limit. As identified previously, R cannot be greater than $R_{crt}=1/(2\pi f_c C_0)$, where C is the loading capacitance of the conversion mechanism.

Therefore, if a specification requires a signal amplitude of $V_o$ and the maximum resistance is illustratively R, then at least $V_o/R$ current is used to meet the specification. Therefore, the tail current for each selection device (or conversion device) needs to be at least ($V_o/R_{crt}/n$). Note this is different from a conventional design, where Vo/Rcrt is necessary.

The tail current magnitude is generated for the first and second conversion modules in the bottom section of FIGS. 5 and 6. In both the first and second conversion modules, transistors MN10 and MN11 (for the first conversion mechanism MN10 64 and MN11 66 in FIG. 5; for the second conversion modules MN10 84 and MN11 86 in FIG. 6) provide the tail current I$_0$ specified by the application of a input voltage bias VB3 96 to a 2nd terminal of MN10 62 or 84 and the application of an input voltage bias VB2 94 to a 2nd terminal of MN11 64 or 86. If the specification calls for a specific current level, bias VB2 94, VB3 96 and physical device sizes of MN10, MN11 may be adjusted to obtain the required/requested level.

As illustrated in FIGS. 5 and 6, a plurality of differential clock signals, such as ck1 100, ck1b 102, ckn 104, and cknb 106, may be utilized to indicate which conversion module is actively converting the parallel bit to a bit in the serial data stream. For example, if the seventh bit is currently being converted, the sixth second conversion module may be currently converting a parallel bit to a bit in a serial datastream, and the differential clock signal may be, illustratively, high to indicate that a parallel bit in that module is being converted. When the seventh bit is being converted, if $ck_7$ is higher than $ck_{7b}$, then the clock signal is high for the sixth second conversion module and the data bit $D_i$ input into that second conversion module is actively being converted from the parallel bit into the bit in the serial datastream. Only one parallel bit is being converted at a single moment in time, so only one clock signal may be, illustratively, high at a single time.

If the first conversion module is active, the current is steered directly through that selection module to the current source. The current is steered by the same control signal, $D_i$ 90 or $D_i$ 91, with the corresponding clock signal, $ck_1$, is high. In the embodiment of the invention illustrated in FIG. 5, if $ck_1$ 100 is greater than $ck_{1b}$ 102, then $ck_1$ 100 is high and the first conversion module is actively converting a parallel bit into a bit in a serial datastream, so MN8 58 is switched on. In relation to FIG. 4, transistors MN4 50 and M14 56 and MN8 58 may all comprise a selection device. When MN8 58 is activated, a current path is established so current flows through MN4 50 or M14 56, plus MN8 58, MN10 62, and MN11 64. The value of the parallel bit, $D_i$ 90 or $D_{ib}$ 92, determines whether current flows through MN4 50 or M14 56, i.e., if $D_i$ 90 is greater than $D_{ib}$ 92, current flows, through MN4 50, and if $D_{ib}$ 92 is greater than $D_i$ 90, current flows through M14 56.

If the first conversion module is not active, then current is steered first to a current steering device and then to the current source. If the first conversion module is inactive, e.g., $ck_{1b}$ 102 is greater than $ck_1$ 100, then $ck_1$ 100 is, illustratively, low, and transistor MN9 60 is activated. Because MN4 50, M14 56, and MN8 58 are not activated, current, from the resistor RD1 or RD2, depending on whether the bit being convert currently is high or low, flows through the cross-coupled pair MN5 52 and MN6 54 to MN9 60. The cross-coupled pair MN5 52 and MN6 54 in combination with MN9 60 represent the current steering device illustrated in FIG. 4. MN4 50 and M14 56 receive no current. In other words, since a different bit other than the 1st bit is being converted at that time, nodes DOP/DON (71/72 in FIG. 5 and 97/95 in FIG. 6) will be controlled by the bit that is being converted at the moment. Because the cross-coupled pair MN5/MN6 is designed to be relative weaker than input devices MN4/MN14, the cross-coupled pair will subdue to the active bit polarity. In the case that there is no bit being transferred, then DOP 71 and DON 72 stay with the last bit value, and MN5 52 and MN6 54 may act as a latch.

In addition, because the cross-coupled pair provides an extra current path, the current, $n \times I_0$, going through resistors is much larger than the current, $I_0$, going through devices MN4 50, M14 56, MN8 59, and MN9 60. In another words, the cross-coupled pair allows large signal swing at output, DOP/DON, without actually running large currents in these switching devices MN4 50, M14 56, MN8 59, and MN9 60. Because the current flowing through MN4 50, M14 56, MN8 59, and MN9 60 is small, the physical size of these transistors may be small. The small size of MN4 50, M14 56, MN8 59, and MN9 60 reduce the loading for the circuits that drive these devices and lead to a reduction in current consumption in the circuits. This is important in high frequency design because too much loading results in high current consumption.

In all of the second conversion modules that are inactive, as illustrated in FIG. 6, $ck_{nb}$ 106 is greater than $ck_n$ 104 and MN9 82 is switched on. The node $I_{out}$ 110 is connected to $I_{in}$ 99 (see FIG. 5), and the 1st terminal of MN9 82. The 1st terminals on all the second conversion module's MN9 transistors 82 are connected to the third terminals of MN5 52 and MN6 54 in the first conversion module, as illustrated in FIG. 5. The coupling of all the inactive second conversion modules MN9 82 transistors to the third terminals of MN5 52 and MN6 54 provides the current path to resistors RD1 and RD2 68 for all of the inactive conversion module's respective current sources. For all of the second conversion modules that are inactive, a current path is established from either MN5 52 or MN6 54, depending on whether Di 91 is high or not, through MN9 82 to the current source, which are transistors MN10 84 and MN11 86.

The present invention illustrates a n-to-1 parallel-to-serial conversion device that includes a voltage output device, n selection devices, a current steering device, and n current sources. N parallel data bits are input into n selection devices. An active selection device is coupled directly to a corresponding current source and provides a bit to the voltage output device. The magnitude of the current from the current source is a predetermined value. The voltage device outputs a value representative of the bit in a serial datastream. The n−1 inactive selection devices do not draw current and a second current is directed to a current steering device. The magnitude of the current in the second current branch is (n−1) times the value of the active selection device current. The current steering device distributes the second current to the (n−1) current sources that correspond to the (n−1) inactive selection device currents. The current steering device allows a path to be established in order that all current is utilized within the parallel-to-serial conversion device.

While the description above refers to particular embodiments of the present invention, it will be understood that many modifications may be made without departing from the spirit thereof. The accompanying claims are intended to cover such modifications as would fall within the true scope and spirit of the present invention. The presently disclosed embodiments are therefore to be considered in all respects as illustrative and not restrictive, the scope of the invention being indicated by the appended claims, rather than the foregoing description, and all changes that come within the meaning and range of equivalency of the claims are intended to be embraced therein.

What is claimed is:

1. A parallel-to-serial conversion device, comprising:
   a voltage output device to produce a voltage representative of a value of a bit in a serial bit datastream converted from a parallel bit utilizing a combined current, the combined current divided into a first current and a second current;
   n number of selection devices to accept as input n number of parallel bits, wherein an active selection device accepts as input the first current and outputs an active selection device current directly to a corresponding current source and (n−1) non-active selection devices are inactive at one time;
   a current steering device, to accept as input the second current, and output (n−1) non-active selection device currents to (n−1) number of current sources, wherein n number of current sources, each corresponding to the n number of selection devices, accepts as input the active selection device current and the (n−1) non-active selection device currents, the combined current having a magnitude of n multiplied by a first current value, and the second current having a magnitude of (n−1) multiplied by the first current value.

2. The conversion device of claim 1, wherein n number of clock signals identify which of the n number of selection devices is actively converting.

3. The conversion device of claim 1, wherein n is equal to eight.

4. The conversion device of claim 1, wherein n is equal to ten.

5. A parallel-to-serial conversion device, comprising:
   a voltage output device to produce a voltage representative of a value of a bit in a serial bit datastream converted from a parallel bit utilizing a combined current, the combined current divided into a first current and a second current;
   n number of selection devices to accept as input n number of parallel bits, wherein an active selection device accepts as input the first current and outputs an active selection device current directly to a corresponding current source and (n−1) non-active selection devices are inactive at one time;
   a current steering device, to accept as input the second current, and output (n−1) non-active selection device currents to (n−1) number of current sources, wherein n number of current sources, each corresponding to the n number of selection devices, accepts as input the active selection device current and the (n−1) non-active selection device currents, wherein the current steering device includes:
      a second terminal of a first transistor and a first terminal of a second transistor coupled to a first differential node of the voltage output device;
      a second terminal of the second transistor and a first terminal of the first transistor coupled to a second differential node of the voltage output device; and
      a third terminal of the first transistor and the second transistor coupled to the (n−1) non-active selection devices.

6. A method of converting n parallel bits one at a time to a bit in a serial bit datastream in a current efficient manner, comprising:
   inputting the n parallel bits to n number of selection devices;
   identifying one of the n number of selection devices as an active selection device and (n−1) number of selection devices as inactive selection devices;
   dividing an output current into a first current and a second current, the output current having a magnitude of n multiplied by a magnitude of the first current and the second current having a magnitude of (n−1) multiplied by the magnitude of the first current;
   directing the first current to the active selection device;
   directly coupling the active selection device to one of n number of current sources;
   directing the second current to a current steering device;
   coupling the current steering device to (n−1) current sources corresponding to the (n−1) inactive selection devices; and
   converting an active parallel bit input via the active selection device to the bit in the serial datastream by generating a voltage representative of a value of the bit utilizing a combined current from the n current sources.

7. The method of claim 6, wherein n number of clock signals identify the active selection device.

8. The method of claim 6, wherein n is equal to eight.

9. The method of claim 6, wherein n is equal to ten.

10. A method of converting n parallel bits one at a time to a bit in a serial bit datastream in a current efficient manner, comprising:
   inputting n parallel bits to n number of selection devices;
   identifying one of the n number of selection devices as an active selection device and (n−1) number of selection devices as inactive selection devices;
   dividing an output current into a first current and a second current;
   directing the first current to the active selection device;
   directly coupling the active selection device to one of n number of current sources;
   directing the second current to a current steering device;
   coupling the current steering device to (n−1) current sources corresponding to the (n−1) inactive selection devices; and
   converting an active parallel bit input via the active selection device to the bit in the serial datastream by generating a voltage representative of a value of the bit utilizing a combined current from the n current sources, wherein the current steering device and the inactive selection devices allow the control of output by the input data bit or latch on a previous data bit if there is no input, namely the current steering device allows a differential current to flow in either direction.

11. A transmitting device, comprising:
   a parallel-to-serial converter to convert n parallel bits one at a time to a bit in a serial bit datastream having:
      a voltage output device to produce a voltage representative of a value of a bit in a serial bit datastream converted from a parallel bit utilizing a combined current, the combined current divided into a first current and a second current;
      n number of selection devices to accept as input n number of parallel bits, wherein an active selection device accepts as input the first current and outputs an active selection device current directly to a corresponding current source and (n−1) non-active selection devices are inactive at one time;
      a current steering device, to accept as input the second current, and output (n−1) non-active selection device currents to (n−1) number of current sources, wherein n number of current sources, each corresponding to the n number of selection devices, accepts as input the active selection device current and the (n−1) non-active selection device currents, the combined current having a magnitude of n multipled by a first current value, and the second current having a magnitude of (n−1) multiplied by the first current value; and
      an output buffer to receive the serial bit in the serial bit datastream from the parallel-to-serial converter and to transmit a differential datastream over a transmission line.

12. The transmitting device of claim 11, further including an equalizer to receive an encoded parallel signal and to output n parallel bits in the parallel bit datastream compensated for channel frequency response to the parallel-to-serial converter.

13. The transmitting device of claim 11, wherein the current steering device and the inactive selection devices allow the control of output by the input data bit or latch on a previous data bit if there is no input, namely the current steering device allows a differential current to flow in either direction.

14. The transmitting device of claim 11, wherein n number of clock signals determine the active selection device.

15. The transmitting device of claim 11, wherein n is equal to ten.

16. The transmitting device of claim 11, wherein n is equal to eight.

17. The transmitting device of claim 11, where the transmitting device is a 10 Gigabit per second Media Independent Interface (XGMII)-to-10 Gigabit per second Attachment Unit Interface (XAUI) transmitting device.

18. A transmitting device, comprising:
  a parallel-to-serial converter to convert n parallel bits one at a time to a bit in a serial bit datastream having:
    a voltage output device to produce a voltage representative of a value of a bit in a serial bit datastream converted from a parallel bit utilizing a combined current, the combined current divided into a first current and a second current;
    n number of selection devices to accept as input n number of parallel bits, wherein an active selection device accepts as input the first current and outputs an active selection device current directly to a corresponding current source and (n−1) non-active selection devices are inactive at one time;
    a current steering device, to accept as input the second current, and output (n−1) non-active selection device currents to (n−1) number of current sources, wherein n number of current sources, each corresponding to the n number of selection devices, accepts as input the active selection device current and the (n−1) non-active selection device currents; and
  an output buffer to receive the serial bit in the serial bit datastream from the parallel-to-serial converter and to transmit a differential datastream over a transmission line, wherein the current steering device includes a second terminal of a first transistor and a first terminal of a second transistor coupled to a first differential node of the voltage output device; a second terminal of the second transistor and a first terminal of the first transistor coupled to a second differential node of the voltage output device; and a third terminal of the first transistor and the second transistor connected to the (n−1) non-active selection devices.

19. A parallel-to-serial conversion device, comprising:
  a plurality of n current sources;
  a plurality of n selection devices, each selection device begin associated with one of said n current sources and being adapted to receive a corresponding one of a plurality of n parallel bits, an active one of said n selection devices receiving a first current and providing an active selection device current to the associated current source, and a plurality of (n−1) remaining non-active selection devices; and
  a current steering device to receive a second current and provide a non-active selection device current to each of said n current sources associated with the plurality of (n−1) remaining non-active selection devices, wherein the second current has a magnitude of (n−1) multiplied by a magnitude of the first current.

20. The device of claim 19, wherein one of a plurality of clock signals identifies which of said selection devices is the active one.

21. The device of claim 19, wherein n=8.

22. The device of claim 19, wherein n=10.

* * * * *